United States Patent
Saito

(10) Patent No.: US 6,806,208 B2
(45) Date of Patent: Oct. 19, 2004

(54) SEMICONDUCTOR DEVICE STRUCTURED TO PREVENT OXIDE DAMAGE DURING HDP CVD

(75) Inventor: Minoru Saito, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/384,578

(22) Filed: Mar. 11, 2003

(65) Prior Publication Data

US 2004/0178479 A1 Sep. 16, 2004

(51) Int. Cl.$^7$ ................................................ H01L 21/31
(52) U.S. Cl. ........................ 438/778; 438/622; 438/632
(58) Field of Search ................................. 438/778, 788, 438/622, 239, 253, 680, 632

(56) References Cited

U.S. PATENT DOCUMENTS

| | | | |
|---|---|---|---|
| 5,981,379 A | * 11/1999 | Tsai | ................... 438/638 |
| 6,144,051 A | 11/2000 | Nishimura et al. | |
| 6,548,349 B2 | * 4/2003 | Kim | ................... 438/253 |
| 6,562,731 B2 | * 5/2003 | Liu et al. | ................... 438/778 |
| 6,602,748 B2 | * 8/2003 | Watatani | ................... 438/239 |

* cited by examiner

Primary Examiner—Long Pham
Assistant Examiner—Hoa B. Trinh
(74) Attorney, Agent, or Firm—Volentine Francos & Whitt, PLLC

(57) ABSTRACT

A semiconductor device includes a patterned conductive layer on which an initial dielectric film is deposited by a non-etching deposition process. A second dielectric film is then deposited on the initial dielectric film by high-density plasma chemical vapor deposition (HDP CVD). The HDP CVD process etches the second dielectric film as it is being deposited, thereby smoothing the surface of the second dielectric film. The initial dielectric film insulates the patterned conductive layer from the plasma used in the HDP CVD process, so that plasma charge is not conducted to underlying oxide films, such as gate oxide films, and does not cause oxide damage.

40 Claims, 5 Drawing Sheets

SEMICONDUCTOR DEVICE STRUCTURED TO PREVENT OXIDE DAMAGE DURING HDP CVD

BACKGROUND OF THE INVENTION

1. Field of the Invention

The present invention relates to a semiconductor device structure and semiconductor device fabrication process.

2. Description of the Related Art

Integrated circuits are generally fabricated by forming circuit elements in a semiconductor substrate, then forming one or more metal interconnection layers above the substrate. Often the circuit elements are field-effect transistors having gate electrodes insulated from the substrate by a thin oxide film referred to as a gate oxide. The metal interconnection layers are insulated from one another, and from the semiconductor substrate, by insulating films referred to as interlayer dielectric films, or simply as interlayer dielectrics. The uppermost metal interconnection layer is covered by a surface passivation film.

The interlayer dielectrics and surface passivation film are often formed by chemical vapor deposition (CVD), a technique in which the substrate is heated, and source gases react near the surface the substrate to form a desired material that is deposited on the substrate. Various types of CVD are known, including low-pressure CVD (LP CVD), atmospheric-pressure CVD (AP CVD), plasma-enhanced CVD (PE CVD) and high-density plasma CVD (HDP CVD). The plasma types of CVD (PE CVD and HDP CVD) have the advantage of being performable at a lower temperature than the other types of CVD (LP CVD and AP CVD). Since the mid-1990s, HDP CVD, which can effectively fill the narrow spaces between adjacent gate electrodes and adjacent interconnecting lines without creating bread-loaf shapes or cusps, has come into widespread use in fabrication processes with half-micrometer and smaller design rules. The reason for the effectiveness of HDP CVD is that the substrate is not only heated but also electrically charged, drawing the plasma down to etch unwanted parts of the deposited film.

This feature of HDP CVD leads to a problem however. During the HDP CVD process, the charge of the plasma is conducted through the metal interconnecting lines and gate electrodes to the gate oxide. In recent devices, the gate oxide is extremely thin, and is vulnerable to damage from the plasma charge. Although the damage mechanism is not completely understood, the damage is thought to result from the trapping of charge in the gate oxide film. Electron microscope studies by the inventor have confirmed that gate oxide damage occurs as a result of HDP CVD.

Such damage can lead to failure of devices in factory tests, thus reducing the yield of the fabrication process, or failure in the field, reducing the reliability of the fabricated devices. Accordingly, there is a need for a fabrication process that retains the advantages of HDP CVD while avoiding damage to thin gate oxide films.

SUMMARY OF THE INVENTION

An object of the present invention is to avoid damage to gate oxide films during HDP CVD.

In the invented method of fabricating a semiconductor device, a patterned conductive layer is formed on a substrate. An initial dielectric film is then deposited by a non-etching deposition process, covering the exposed surfaces of the patterned conductive layer and the substrate. Next, a second dielectric film is deposited on the initial dielectric film by HDP CVD.

The initial dielectric film is preferably less than one hundred nanometers thick. A thin initial dielectric film can be formed without creating cusps or bread-loaf shapes, even though a non-etching deposition process is used, and without damaging the patterned conductive layer, even if a comparatively high-temperature deposition process is used.

Since the initial dielectric film covers the exposed surfaces of the patterned conductive layer, when HDP CVD is used to deposit the second dielectric film, the plasma charge is not conducted to the patterned conductive layer, and accordingly is not conducted to any gate oxide films present in the semiconductor device. Gate oxide damage is thereby avoided during HDP CVD.

The invention also provides a semiconductor device fabricated by the process described above.

DETAILED DESCRIPTION OF THE INVENTION

Figure 1:
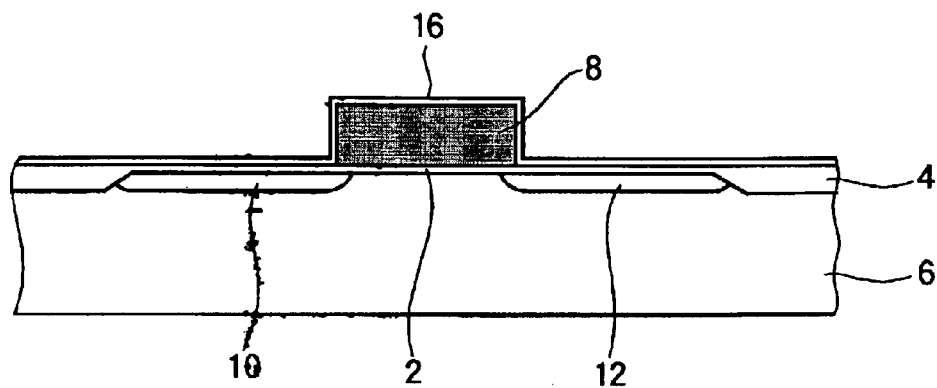
FIGS. 1, 2, and 3 show three stages in the formation of a semiconductor device according to a first embodiment of the invention.

Embodiments of the invention will now be described with reference to the attached drawings, in which like elements are indicated by like reference characters. The drawings illustrate the formation of one part of a semiconductor integrated circuit. More specifically, the drawings illustrate the formation of one field-effect transistor.

Figure 2:
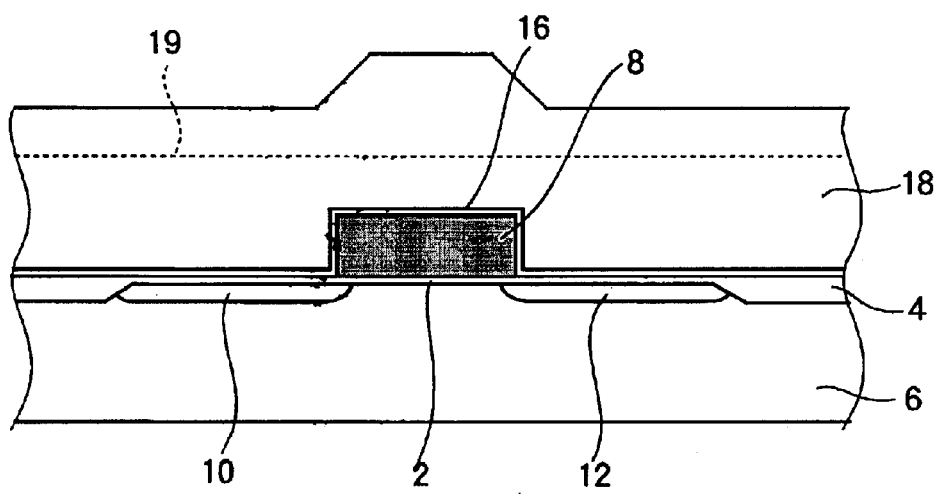
Figure 3:
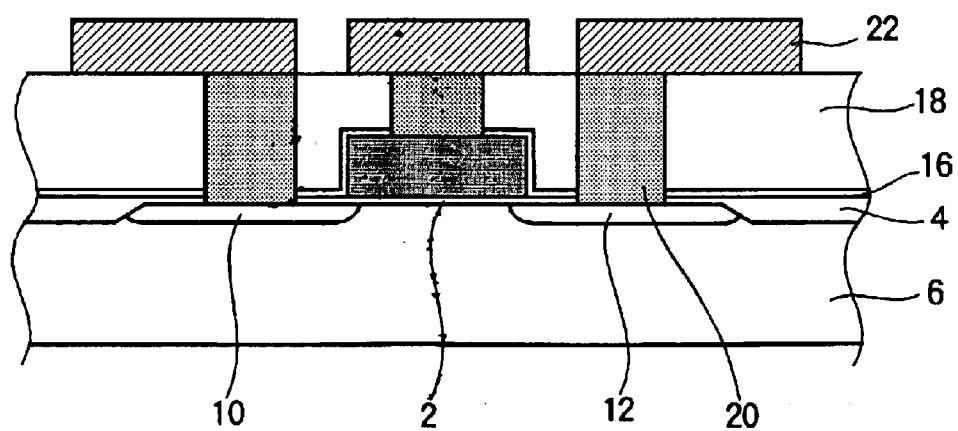

FIGS. 1 to 3 illustrate three stages in the fabrication of a semiconductor device according to a first embodiment of the invention. In FIG. 1, a gate oxide film 2 and field oxide layer 4 have been formed on and within a silicon semiconductor substrate 6. The field oxide 4 may be formed by a well-known method such as local oxidation of silicon (LOCOS) or shallow trench isolation (STI). A gate electrode 8 has been formed on the gate oxide film 2, and source and drain diffusions 10, 12 have been formed in the substrate 6. The gate electrode 8 comprises, for example, a conductive polycrystalline silicon (polysilicon) material, or conductive polysilicon with an additional metal silicide layer, and is part of a patterned conductive layer that may include many interconnected gate electrodes.

Following formation of the gate electrode 8, an initial dielectric film 16 of silicon nitride ($Si_3N_4$) a few nanometers or a few tens of nanometers thick is deposited by low-pressure chemical vapor deposition (LP CVD). The initial dielectric film 16 covers the exposed surfaces of the gate oxide film 2, field oxide 4, substrate 6, and gate electrode 8. Since LP CVD is a thermal reaction process, the thickness of the initial dielectric film 16 should be less than one hundred nanometers (100 nm), so that the process does not continue for an extended time.

The first embodiment is not limited to the use of silicon nitride or LP CVD. The initial dielectric film 16 may be deposited by another non-etching type of CVD, such as plasma-enhanced CVD (PE CVD) or atmospheric-pressure CVD (AP CVD). In PE CVD, plasma is released from a so-called shower head above the substrate, but chemical reactions take place before the plasma reaches the substrate surface, so the film deposited on the substrate surface is not etched by the plasma. In AP CVD, no plasma is released from the shower head, and no etching takes place. The same is true of LP CVD. For AP CVD, the silicon source gas is preferably tetraethylorthosilicate (TEOS).

Referring to FIG. 2, an interlayer dielectric film 18 of, for example, silicon dioxide ($SiO_2$) is now formed on the surface of the initial dielectric film 16 by high-density plasma CVD (HDP CVD). The interlayer dielectric film 18 is planarized by chemical mechanical polishing, which reduces the surface of the interlayer dielectric film 18 to the level indicated by the dotted line 19. The interlayer dielectric film 18 may have any thickness adequate to provide satisfactory interlayer insulation; typical thicknesses are one thousand five hundred nanometers (1500 nm) before planarization and one thousand nanometers (1000 nm) after planarization.

The first embodiment is not limited to the use of silicon dioxide for the interlayer dielectric film 18. The interlayer dielectric film 18 may be formed from another dielectric material, such as fluorinated silicon oxide (SiOF)

Referring to FIG. 3, contact holes are formed in the interlayer dielectric film 18, the initial dielectric film 16, and the gate oxide film 2, and one or more layers of metal are deposited and patterned to form contacts 20 and interconnecting lines 22. These steps are carried out by well-known processes such as photolithography and etching.

Next, the interconnecting lines 22 may be covered by a surface passivation film (not shown), or a further interlayer dielectric film (not shown) may be deposited and a further layer of interconnections (not shown) may be formed.

During the HDP CVD process that deposits the interlayer dielectric film 18, the conductive material of the gate electrode is not directly exposed to the plasma, so the electrical charge of the plasma is not conducted to the underlying gate oxide film 2. Electrical damage to the gate oxide film 2 is thereby avoided, reducing the rate of failures in factory tests and in the field.

FIGS. 4 to 7 illustrate four stages in the fabrication of a semiconductor device according to a second embodiment of the invention. The second embodiment is similar to the first embodiment but has self-aligned contacts.

Figure 4:
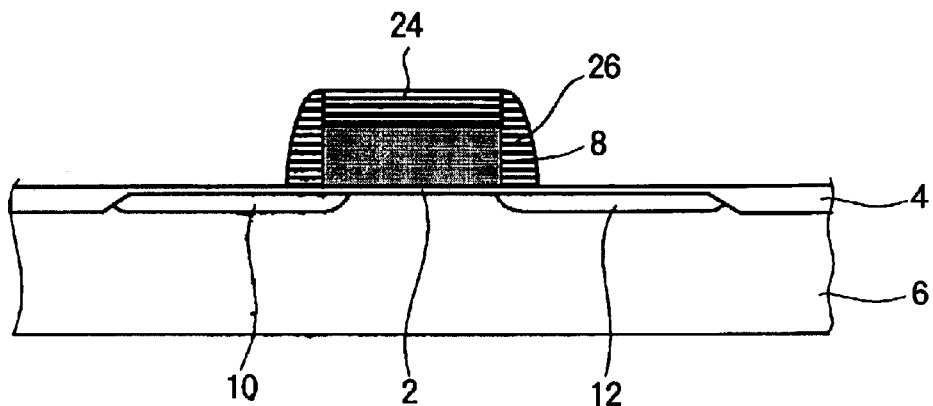
FIGS. 4, 5, 6, and 7 show four stages in the formation of a semiconductor device according to a second embodiment of the invention.

In FIG. 4, a gate oxide film 2, field oxide layer 4, and gate electrode 8 have been formed as in the first embodiment, and source and drain diffusions 10, 12 have been formed in the substrate 6. In addition, a dielectric film 24 has been deposited on the upper surface of the gate electrode 8, and dielectric sidewalls 26 have been formed on the sides of the gate electrode 8. The dielectric film 24 and sidewalls 26 may be formed from silicon nitride or another suitable dielectric material.

Figure 5:
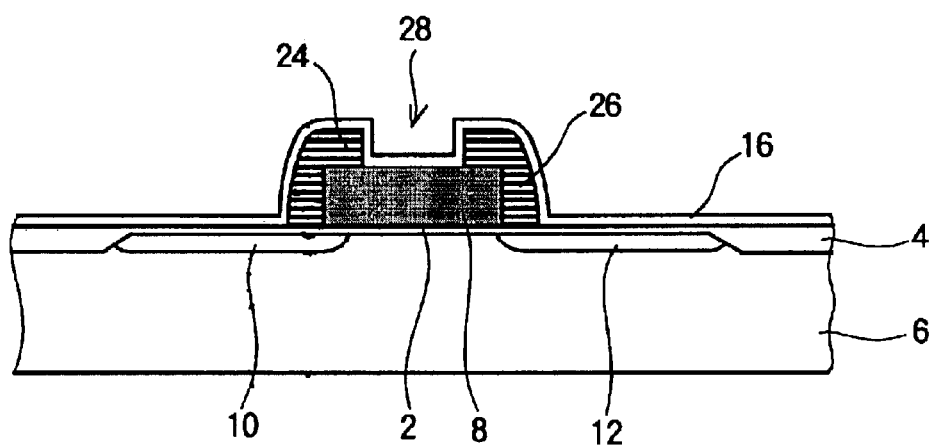

In FIG. 5, a contact window 28 is opened in the dielectric film 24 on the upper surface of the gate electrode 8. Then an initial dielectric film 16 of silicon nitride ($Si_3N_4$) a few nanometers or a few tens of nanometers thick is formed by LP CVD, covering the exposed surfaces of the gate oxide film 2, field oxide 4, substrate 6, gate electrode 8, dielectric film 24, and dielectric sidewalls 26.

The second embodiment is not limited to the use of silicon nitride and LP CVD for the initial dielectric film 16; other materials and other non-etching deposition processes may be used instead, as described in the first embodiment.

Figure 6:
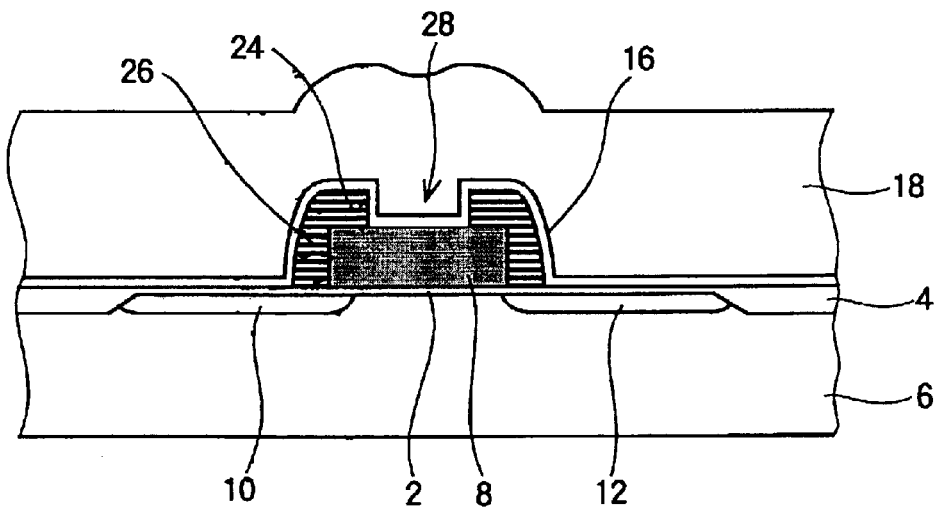

Referring to FIG. 6, an interlayer dielectric film 18 of silicon dioxide ($SiO_2$) or another suitable material is now formed on the surface of the initial dielectric film 16 by HDP CVD.

Figure 7:
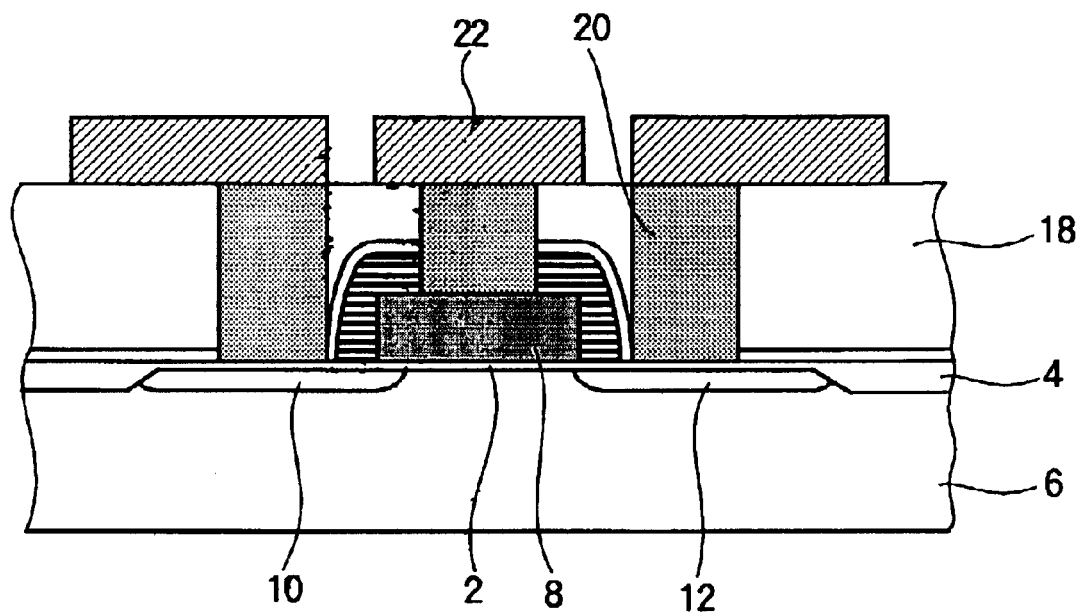

Referring to FIG. 7, the interlayer dielectric film 18 is planarized by chemical-mechanical polishing; then contact holes are formed in the interlayer dielectric film 18, initial dielectric film 16, and gate oxide film 2, and one or more layers of metal are deposited and patterned, forming contacts 20 and interconnecting lines 22 as in the first embodiment. Compared with the first embodiment, the dielectric sidewalls 26 enable the source and drain contacts to be placed closer to the gate electrode 8 without risk of a short circuit.

During the HDP CVD process that deposits the interlayer dielectric film 18, the window 28 in the dielectric film 24 on the gate electrode 8 is protected by the initial dielectric film 16, as shown in FIG. 6, so that the conductive gate electrode material is not directly exposed to the plasma. As in the first embodiment, this prevents electrical damage to the gate oxide 2 by preventing the electrical charge of the plasma from being conducted to the gate oxide film 2. Fabrication process yields and device reliability are thereby improved.

Figure 8:
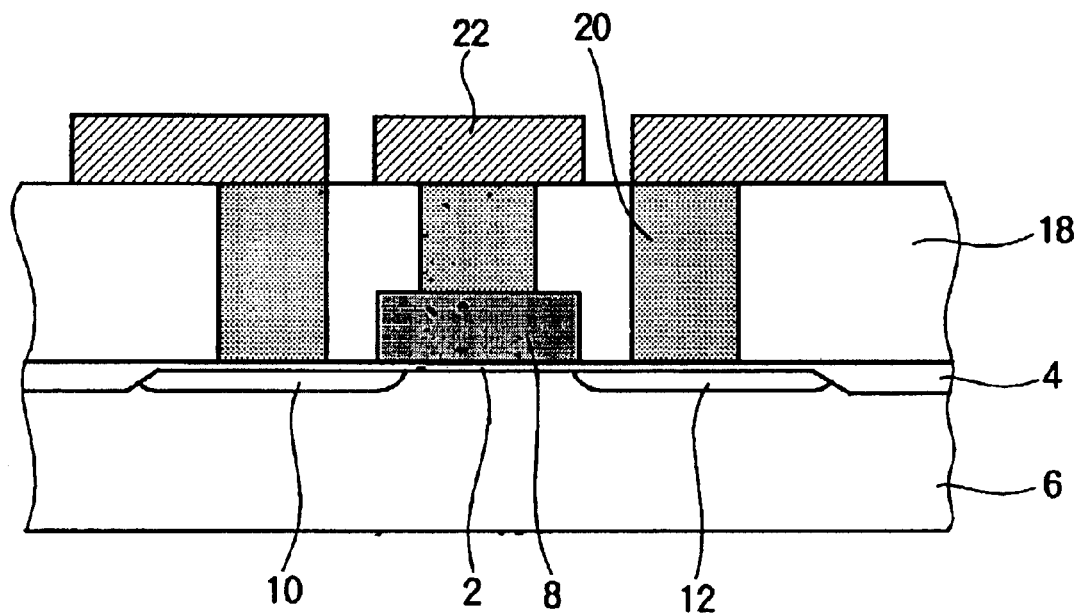
FIGS. 8, 9, and 10 show three stages in the formation of a semiconductor device according to a third embodiment of the invention.
Figure 9:
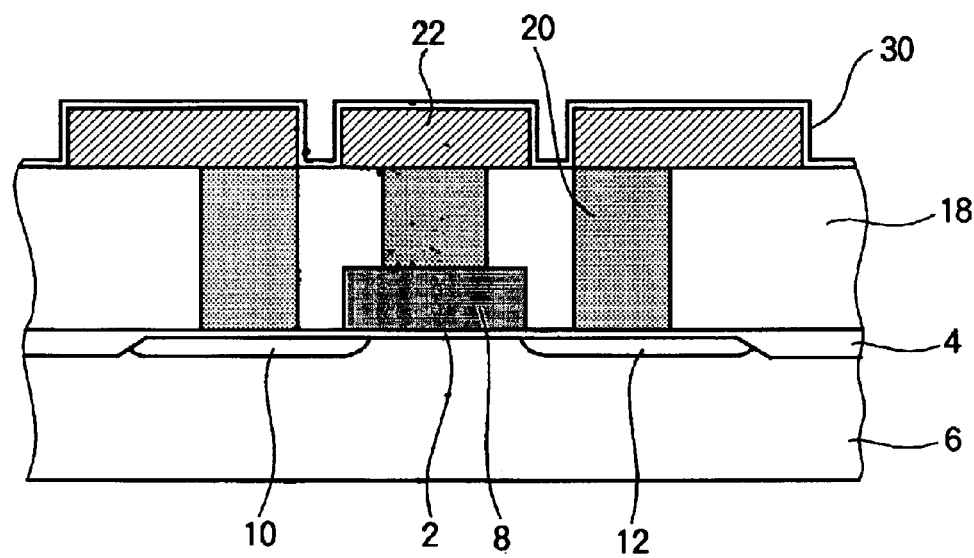
Figure 10:
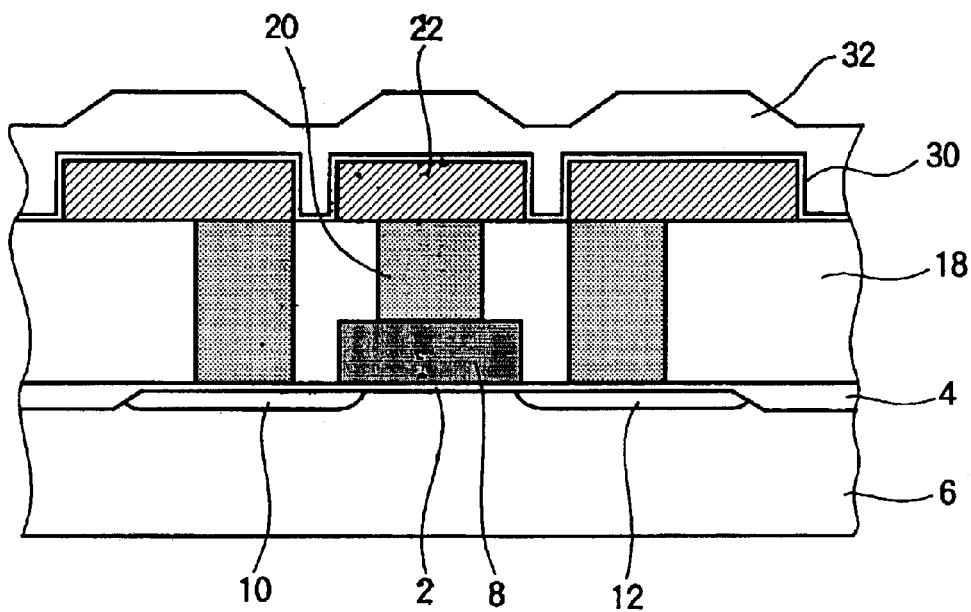

FIGS. 8 to 10 illustrate three stages in the fabrication of a semiconductor device according to a third embodiment of the invention. The third embodiment protects the gate oxide film 2 from electrical damage during the formation of a surface passivation film above the metal interconnecting layer.

In FIG. 8, source and drain diffusions 10, 12 have been formed in a substrate 6, and a gate oxide film 2, field oxide layer 4, gate electrode 8, interlayer dielectric film 18, contacts 20, and interconnecting lines 22 have been formed by a conventional process. If necessary, an initial dielectric film 16 (not shown) may be formed before the interlayer dielectric film 18 is deposited, as described in the first embodiment. The interconnecting lines 22 constitute a patterned conductive layer.

In FIG. 9, an initial dielectric film 30 is deposited on the exposed surfaces of the interlayer dielectric film 18 and the interconnecting lines 22. The initial dielectric film 30 is, for example, a silicon nitride film approximately twenty nanometers (20 nm) thick, and is deposited by LP CVD or another non-etching type of CVD.

The third embodiment is not limited to the use of silicon nitride for the initial dielectric film 30; other dielectric materials may be used instead.

Referring to FIG. 10, a surface passivation film 32 of silicon nitride (SiN) or another suitable material such as silicon oxynitride (SiON) is now deposited on the surface of the initial dielectric film 30 by HDP CVD. The interlayer dielectric film 18 may have any suitable thickness; typical thicknesses are in the range from five hundred to one thousand nanometers: e.g., a thickness of about 850 nm.

During the HDP CVD process that forms the surface passivation film 32, since the metal interconnecting lines 22 are covered by the initial dielectric film 30, the electrical charge of the plasma is not conducted through them and through the gate electrode 8 to the gate oxide film 2, which is thereby protected from electrical damage. Fabrication process yields and device reliability are improved accordingly.

In a variation of the third embodiment, the same technique is used to protect the gate oxide film 2 from damage during the formation of interlayer dielectric films between multiple metal wiring layers, by depositing an initial dielectric layer below each interlayer dielectric film to cover any exposed electrically conductive surfaces before HDP CVD is carried out.

Figure 11:
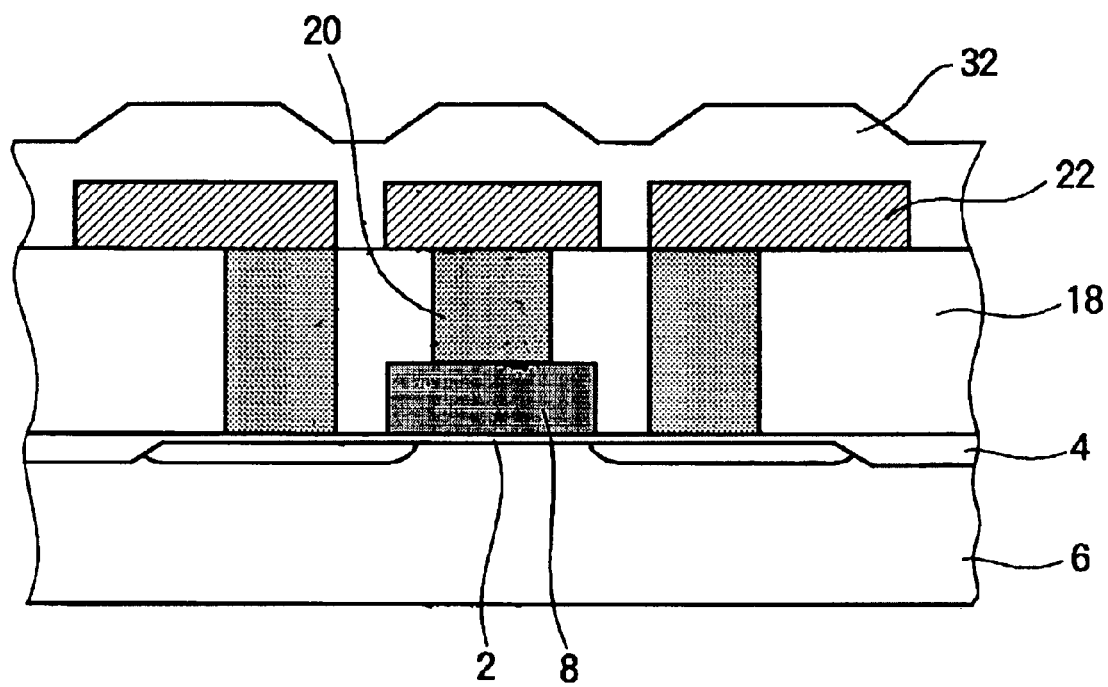
FIG. 11 shows a stage in the formation of a conventional semiconductor device.

For comparison with the preceding embodiments, FIG. 11 shows a semiconductor device formed by a conventional process. The device in FIG. 11 has an interlayer dielectric film 18 and a surface passivation film 32, both formed by HDP CVD, but lacks the initial dielectric film 16 of the first embodiment and the initial dielectric film 30 of the third embodiment. During the HDP CVD process that forms the interlayer dielectric film 18, plasma charge is conducted through the gate electrode 8 to the gate oxide film 2, and damage may occur to the gate oxide film 2 below the gate electrode 8. During the HDP CVD process that forms the surface passivation film 32, plasma charge is conduced through the conductive lines 22, contacts 20, and gate electrode 8 to the gate oxide film 2, and further oxide damage may occur. The suspected cause of the oxide damage is a surge of current at the end of each HDP CVD process.

Although the invention has been described as preventing damage to a gate oxide film, the invention may also be used to prevent electrical damage to other oxide films, such as capacitor oxide films, during HDP CVD.

Those skilled in the art will recognize that further variations are possible within the scope of the invention, which is defined in the appended claims.

What is claimed is:

1. A method of fabricating a semiconductor device, comprising:
    forming an insulating film on a surface of a substrate;
    forming a patterned conductor layer on the insulating film;
    depositing a first dielectric film covering exposed surfaces of the patterned conductive layer and the insulating film by a non-etching deposition process; and
    depositing a second dielectric film on the first dielectric film by high-density plasma chemical vapor deposition (CVD), the first dielectric film preventing plasma charge from being conducted through the patterned conductive layer to the insulating film.

2. The method of claim 1, wherein the first dielectric film is deposited by low-pressure CVD.

3. The method of claim 1, wherein the first dielectric film is deposited by atmospheric-pressure CVD using tetraethylorthosilicate.

4. The method of claim 1, wherein the first dielectric film is deposited by plasma-enhanced CVD.

5. The method of claim 1, wherein the first dielectric film comprises silicon nitride.

6. The method of claim 1, wherein the first dielectric film is less than one hundred nanometers thick.

7. The method of claim 1, wherein the patterned conductive layer includes a gate electrode.

8. The method of claim 1, wherein the patterned conductive layer is a metal interconnection layer.

9. The method of claim 1, wherein the second dielectric film is an interlayer dielectric film.

10. The method of claim 1, wherein the second dielectric film is a surface passivation film.

11. A semiconductor device comprising:
    a substrate;
    an insulating film disposed on a surface of the substrate:
    a patterned conductive layer disposed on the insulating film;
    a first dielectric film disposed on exposed surfaces of the patterned conductive layer and the insulating film, the first dielectric film being deposited by a non-etching deposition process; and
    a high-density plasma CVD dielectric film disposed on the first dielectric film.

12. The semiconductor device of claim 11, wherein the first dielectric film is deposited by low-pressure CVD.

13. The semiconductor device of claim 11, wherein the first dielectric film is deposited by atmospheric-pressure CVD using tetraethylorthosilicate.

14. The semiconductor device of claim 11, wherein the first dielectric film is deposited by plasma-enhanced CVD.

15. The semiconductor device of claim 11, wherein the first dielectric film comprises silicon nitride.

16. The semiconductor device of claim 11, wherein the first dielectric film is less than one hundred nanometers thick.

17. The semiconductor device of claim 11, wherein the patterned conductive layer includes a gate electrode.

18. The semiconductor device of claim 11, wherein the patterned conductive layer is a metal interconnection layer.

19. The semiconductor device of claim 11, wherein the high-density plasma CVD dielectric film is an interlayer dielectric film.

20. The semiconductor device of claim 11, wherein the high-density plasma CVD dielectric film is a surface passivation film.

21. A method of fabricating a semiconductor device, comprising:
    forming an insulating film on a surface on a substrate;
    forming a first patterned conductive layer on the insulating film;
    depositing a first dielectric film covering the insulating film and the first patterned conductive layer;
    forming contact holes in the first dielectric film;
    forming a second patterned conductive layer on the first dielectric film, the second patterned conductive layer being electrically interconnected with the first patterned conductive layer through the contact holes;
    depositing a second dielectric film covering exposed surfaces of the second patterned conductive layer and the first dielectric film by a non-etching deposition process; and
    depositing a third dielectric film on the first dielectric film by high-density plasma chemical vapor deposition (CVD), the second dielectric film preventing plasma charge from being conducted through the first and second patterned conductive layers to the insulating film.

22. The method of claim 21, wherein the second dielectric film is deposited by low-pressure CVD.

23. The method of claim 21, wherein the second dielectric film is deposited by atmospheric-pressure CVD using tetraethylorthosilicate.

24. The method of claim 21, wherein the second dielectric film is deposited by plasma-enhanced CVD.

25. The method of claim 21, wherein the second dielectric film comprises silicon nitride.

26. The method of claim 21, wherein the second dielectric film is less than one hundred nanometers thick.

27. The method of claim 21, wherein the first patterned conductive layer includes a gate electrode.

28. The method of claim 21, wherein the second patterned conductive layer is a metal interconnection layer.

29. The method of claim 21, wherein the third dielectric film is an interlayer dielectric film.

30. The method of claim 21, wherein the third dielectric film is a surface passivation film.

31. A semiconductor device comprising:

a substrate;

an insulating film disposed on the substrate;

a first patterned conductive layer disposed on the insulating film;

a first dielectric film disposed on exposed surfaces of the first patterned conductive layer and the insulating film, the first dielectric film having contact holes;

a second patterned conductive layer disposed on the first dielectric film, the second patterned conductive layer being electrically interconnected with the first patterned conductive layer through the contact holes;

a second dielectric film disposed on exposed surfaces of the second patterned conductive layer and the first dielectric film, the second dielectric film being deposited by a non-etching deposition process; and a high-density plasma CVD dielectric film disposed on the second dielectric film.

32. The semiconductor device of claim 31, wherein the second dielectric film is a film deposited by low-pressure CVD.

33. The semiconductor device of claim 31, wherein the second dielectric film is a film deposited by atmospheric pressure CVD using tetraethylorthosilicate.

34. The semiconductor device of claim 31, wherein the second dielectric film is a film deposited by plasma-enhanced CVD.

35. The semiconductor device of claim 31, wherein the second dielectric film is a film comprising silicon nitride.

36. The semiconductor device of claim 31, wherein the second dielectric film is less than one hundred nanometers.

37. The semiconductor device of claim 31, wherein the first patterned conductive layer includes a gate electrode.

38. The semiconductor device of claim 31, wherein the second patterned conductive layer is a metal interconnection layer.

39. The semiconductor device of claim 31, wherein the high-density plasma CVD dielectric film is an interlayer dielectric film.

40. The semiconductor device of claim 31, wherein the high-density plasma CVD dielectric film is a surface passivation film.

* * * * *